US012254219B2

(12) United States Patent
Ou et al.

(10) Patent No.: US 12,254,219 B2
(45) Date of Patent: Mar. 18, 2025

(54) NON-VOLATILE DATA STORAGE DEVICE HAVING A PLURALITY OF DIES ACCESSED IN AN INTERLEAVED MANNER

(71) Applicant: Silicon Motion, Inc., Jhubei (TW)

(72) Inventors: Hsu-Ping Ou, Zhubei (TW); Kuang-Ting Tai, Zhubei (TW)

(73) Assignee: SILICON MOTION, INC., Jhubei (TW)

( * ) Notice: Subject to any disclaimer, the term of this patent is extended or adjusted under 35 U.S.C. 154(b) by 0 days.

(21) Appl. No.: 18/361,150

(22) Filed: Jul. 28, 2023

(65) Prior Publication Data
US 2024/0053928 A1 Feb. 15, 2024

(30) Foreign Application Priority Data

Aug. 15, 2022 (TW) .................................. 111130526

(51) Int. Cl.
*G06F 3/06* (2006.01)
(52) U.S. Cl.
CPC .......... *G06F 3/0659* (2013.01); *G06F 3/0604* (2013.01); *G06F 3/0679* (2013.01)
(58) Field of Classification Search
CPC .... G06F 3/0659; G06F 3/0604; G06F 3/0679; G06F 3/0611; G06F 3/064; G06F 3/0658; G11C 29/028; G11C 29/023

USPC ......................................................... 711/154
See application file for complete search history.

(56) References Cited

U.S. PATENT DOCUMENTS

| | | | |
|---|---|---|---|
| 6,448,799 B1 | 9/2002 | Niwa | |
| 7,721,137 B2 | 5/2010 | Lin | |
| 9,158,330 B1 | 10/2015 | Bar-Lev | |
| 10,475,492 B1 | 11/2019 | Yang et al. | |
| 11,289,135 B1* | 3/2022 | Nakazawa | ............. G11C 7/222 |
| 2017/0031845 A1* | 2/2017 | Tzafrir | ....................... G06F 1/04 |
| 2018/0081833 A1 | 3/2018 | Giovannini | |

FOREIGN PATENT DOCUMENTS

| | | |
|---|---|---|
| CN | 104407997 B | 9/2017 |
| TW | I689931 B | 4/2020 |

\* cited by examiner

*Primary Examiner* — Hua J Song
(74) *Attorney, Agent, or Firm* — McClure, Qualey & Rodack, LLP

(57) ABSTRACT

A technique for signal deskew at the non-volatile memory side. The non-volatile memory includes a plurality of dies and a signal timing adjustment circuit. The dies are grouped into storage zones. A controller is coupled to the non-volatile memory through a plurality of data lines. Through the data lines, the controller issues a plurality of commands to provide zone delay parameters to the non-volatile memory to drive the signal timing adjustment circuit at the non-volatile memory side to separately adjust data-line timing of the different storage zones.

19 Claims, 4 Drawing Sheets

NON-VOLATILE DATA STORAGE DEVICE HAVING A PLURALITY OF DIES ACCESSED IN AN INTERLEAVED MANNER

CROSS REFERENCE TO RELATED APPLICATIONS

This application claims priority of Taiwan Patent Application No. 111130526, filed on Aug. 15, 2022, the entirety of which is incorporated by reference herein.

BACKGROUND OF THE INVENTION

Field of the Invention

The present invention relates to clock and data deskew for a data storage device.

Description of the Related Art

There are various forms of non-volatile memory (NVM) for long-term data storage, such as flash memory, magnetoresistive random access memory (magnetoresistive RAM), ferroelectric RAM, resistive RAM, spin transfer torque-RAM (STT-RAM), and so on. These types of non-volatile memory may be used as the storage medium in a data storage device.

Non-volatile memory usually has its own special storage characteristics and requires a corresponding storage architecture. In this technical field, a control technology must be developed based on the storage architecture of the non-volatile memory.

BRIEF SUMMARY OF THE INVENTION

A clock and data deskew technology for a data storage device using a non-volatile memory is shown.

A data storage device in accordance with an exemplary embodiment of the present invention includes a non-volatile memory, a controller, and a plurality of data lines coupling the controller to the non-volatile memory. The non-volatile memory includes a plurality of dies (memory chips), and a signal timing adjustment circuit. The dies are grouped into storage zones Through the data lines, the controller issues a plurality of commands to provide zone delay parameters to the non-volatile memory to drive the signal timing adjustment circuit to separately adjust data-line timing of the different storage zones.

In an exemplary embodiment, each die corresponds to multiple data lines for reading and writing. The commands each uses address information to specify the specific data-line number of a specific storage zone of the non-volatile memory to set its read delay parameter and the write delay parameter.

In an exemplary embodiment, the dies of the non-volatile memory are accessed through a plurality of channels. The dies sharing the same channel are activated by a plurality of chip-enable signals in an interleaved way. Each chip-enable signal controls at least one die in each channel. Each die is coupled to multiple data lines which have different data-line numbers.

In an exemplary embodiment, the commands each uses the address information to specify a specific data-line number of a specific channel to set its read delay parameter and write delay parameter.

In an exemplary embodiment, each command further specifies a specific chip-enable signal to indicate, in a more fine-grained manner, the specified target storage zone for delay-parameter setting.

In an exemplary embodiment, each command further specifies a specific die activated by the specified chip-enable signal to indicate, in a more fine-grained manner, the specified storage zone for delay-parameter setting.

In an exemplary embodiment, each command further indicates a timing shift unit, the read delay length presented by the timing shift unit, and the write delay length presented by the timing shift unit.

In an exemplary embodiment, the signal timing adjustment circuit electrically delays read data transmission on the data lines, and the signal timing adjustment circuit electrically delays interpretation of write data received from the data lines.

In an exemplary embodiment, when the data storage device is powered on, the controller performs delay parameter training on the different storage zones of the non-volatile memory, and then issues the commands to the non-volatile memory through the data lines to return training results to the non-volatile memory as the zone delay parameters.

In an exemplary embodiment, the controller reads the non-volatile memory to obtain and execute an in-system program code after the signal timing adjustment circuit responds to the commands issued from the controller to complete signal timing adjustment of data lines for each storage zone.

In an exemplary embodiment, a non-volatile memory control method based on the forgoing concepts is shown.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
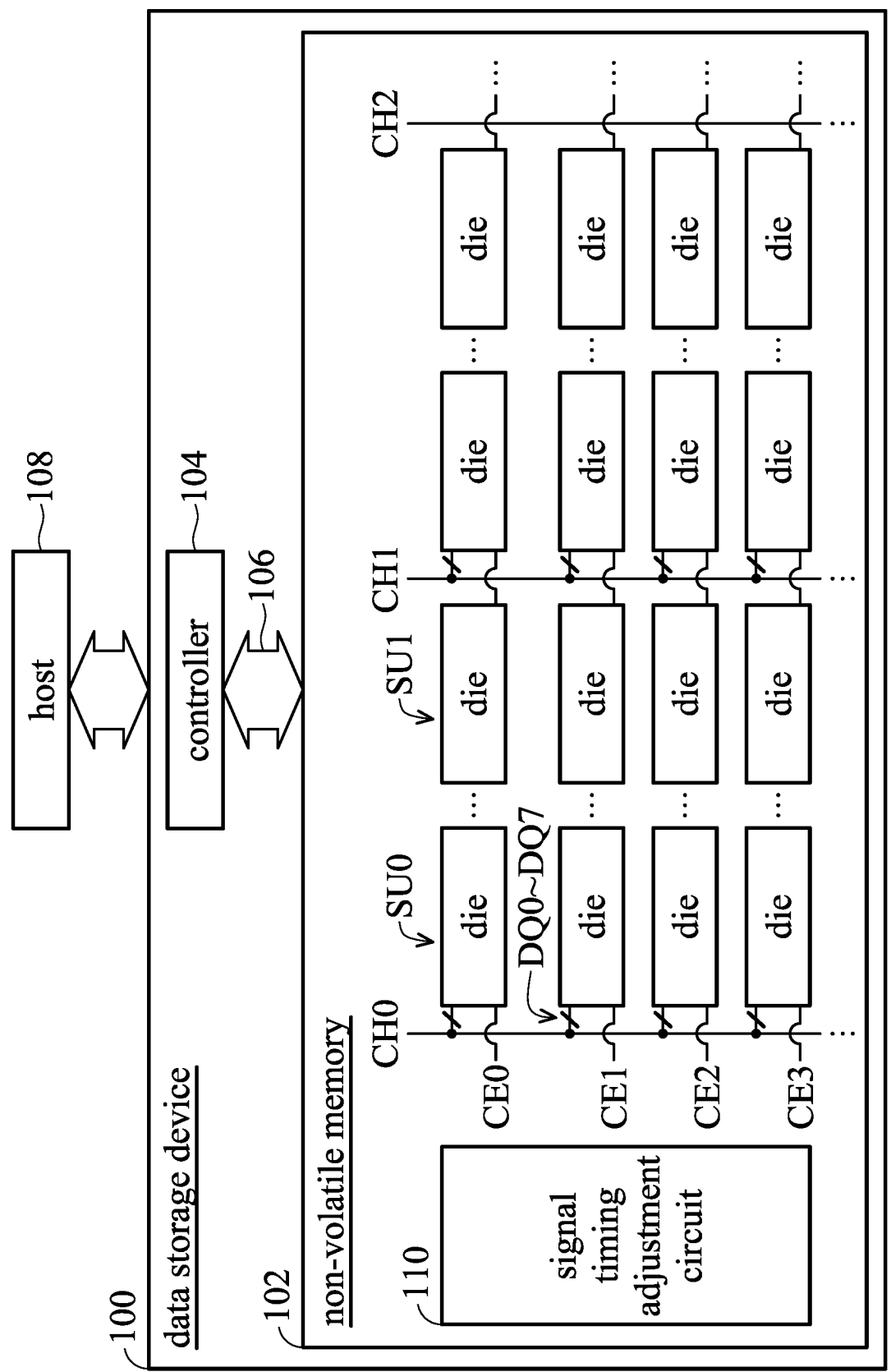
FIG. 1 illustrates a data storage device 100 in accordance with an exemplary embodiment of the present invention.

The following description is made for the purpose of illustrating the general principles of the invention and should not be taken in a limiting sense. The scope of the invention is best determined by reference to the appended claims.

A non-volatile memory for long-term data retention may be a flash memory, a magnetoresistive random access memory (magnetoresistive RAM), a ferroelectric RAM, a resistive RAM, a spin transfer torque-RAM (STT-RAM) and so on. The following discussion uses flash memory as an example.

Today's data storage devices often use flash memory as the storage medium for storing user data from the host. There are many types of data storage devices, including memory cards, universal serial bus (USB) flash devices, solid-state drives (SSDs), and so on. In another exemplary embodiment, a flash memory may be packaged with a controller to form a multiple-chip package called eMMC (embedded multimedia card).

A data storage device using a flash memory as a storage medium can be applied in a variety of electronic devices, including a smartphone, a wearable device, a tablet computer, a virtual reality device, etc. A calculation module of an electronic device may be regarded as a host that operates the data storage device equipped on the electronic device to access the flash memory within the data storage device.

A data center may be built with data storage devices using flash memories as the storage medium. For example, a server may operate an array of SSDs to form a data center. The server may be regarded as a host that operates the SSDs to access the flash memories within the SSDs.

Flash memory has its special storage characteristics. A host may issue logical addresses (for example, logical block addresses LBAs or global host page numbers GHPs) to read or write the flash memory. Logical addresses need to be mapped to physical addresses of the physical space of the flash memory. The mapping rule depends on the architecture of a flash memory.

The physical space of a flash memory is divided into a plurality of blocks for storage. A flash memory should be erased in units of blocks. The data in the same block should be erased together, and the storage space of a flash memory is released block by block. In an example, each block BLK includes a plurality of pages (e.g., page 0 to page 255), each page includes a plurality of sectors (e.g., 32 sectors per page), and each sector may store 512B user data. Thus, each page may provide a data area of 16 KB, and may have a 2B spare area attached at the end. The spare area may be allocated to store mapping data, and the other information as meta data.

In some exemplary embodiments, a multi-channel technology is applied to improve the data throughput, by which a flash memory is accessed through multiple channels. A flash memory may have a plurality of dies (memory chips). The dies may be divided into groups to be accessed through the different channels. In the same group, the dies sharing the same channel may be activated in an interleaved way. For example, the dies in the same group may be alternately activated by a plurality of chip-enable signals (CE #, where # numbers the chip-enable signal). In an exemplary embodiment, the pages accessed at the same time through the different channels are treated as a super page, and the blocks owning the parallel accessed pages are treated as a super block. By the multi-channel technology, the storage space of a super block may be programmed in the order of the super page number (from low number to high number).

In an exemplary embodiment, the same chip-enable signal (CE #, where # numbers the chip-enable signal) enables at least one die of each channel, and each die is connected to a plurality of data lines (DQ #, where # numbers the data lines from 0 to 7 in general).

As the process technology advances, a non-volatile memory may have the more dies. For example, a non-volatile memory may include 8 dies, 16 dies, 32 dies, or even more dies. Data lines for accessing such a large number of dies are complicated in wiring, and the transmission of data needs to be aligned with the data control signals RE/CLK/DQS. It means that a considerable number of delay parameters are required for signal deskew. There is a need for a large space to store the delay parameters.

In particular, different data lines in the data lines (DQ0-DQ7 for 8 bits) corresponding to the same die may be separately used for read/write delay adjustment. In an example, a non-volatile memory is accessed through N1 channels and activated by N2 chip-enable signals. If every N3 dies of the same channel share one chip-enable signal, the number of read/write delay parameters will be N1×N2×N3×8×2, which is quite huge. Such a considerable number of read/write delay parameters may occupy a large number of registers in the controller that controls the non-volatile memory.

In order to avoid occupying too many resources at the controller side, the read and write data are aligned at the non-volatile memory side according to the present invention.

FIG. 1 illustrates a data storage device 100 in accordance with an exemplary embodiment of the present invention, which includes a non-volatile memory 102, a controller 104, and a plurality of data lines 106 coupling the controller 104 to the non-volatile memory 102. A host 108 may operate the data storage device 100 to read/write the non-volatile memory 102.

The non-volatile memory 102 uses a plurality of channels (CH0, CH1, CH2 . . . ) to manage a plurality of dies. The dies accessed through the same channel are accessed in an interleaved way according to a plurality of chip-enable signals (CE0, CE1, CE2, CE3 . . . ). In each channel, each chip-enable signal may activate at least one die. In the figure, multiple dies (SU0, SU1 . . . ) in the same channel are driven by one chip-enable signal. Each die is connected to a plurality of data lines DQ0 to DQ7 and are read or write through the data lines DQ0 to DQ7. In the present invention, a signal timing adjustment circuit 110 is specially designed at the non-volatile memory 102 side.

Through the data lines 106, the controller 104 issues a plurality of commands to provide zone delay parameters to the non-volatile memory 102 and, accordingly, the signal timing adjustment circuit 110 separately adjusts the data line (DQ0-DQ7) timing of the different storage zones. In the same storage zone, the delay parameters of the different dies are uniformed.

In an exemplary embodiment, the commands each uses address information to specify a storage zone of the non-volatile memory 102, wherein a data-line number (DQ_S) is also specified by the address information. According to such a command, read and write delay parameters for the specified data lines DQ_S connected to the all dies within the specified storage zone are set. In the same zone, the signal timing of the data lines with the specific data-line number (DQ_S) are adjusted by the same read/write delay parameters.

The so-called storage zones may have various sizes.

In an exemplary embodiment, the dies accessed through the same channel are regarded as within the same storage zone (e.g., grouped by CH). The proposed command indicates address information to specify a channel CH_S and a data-line number (DQ_S), to set the read/write delay parameters of the specified data lines DQ_S connected to all dies accessed through the specified channel CH_S. For example, all data lines DQ0 connected to all dies accessed through the channel CH0 use the same read/write delay parameters. The read/write delay parameters applied to the data lines DQ0 connected to the dies accessed through the channel CH2 may be different from those applied to the data lines DQ0 of the dies accessed through the channel CH0.

In another exemplary embodiment, the dies are grouped in a more fine-grained manner (further grouped by CE). The proposed command may use address information to specify: a specific channel CH_S; a specific chip-enable signal number (CE_S); and a specific data-line number (DQ_S). For example, the same read delay parameters and the same write delay parameters are applied to the data lines DQ0 of the dies controlled by the chip-enable signal CE0 and accessed through the channel CH0. As for the data lines DQ0 of the dies controlled by the chip-enable signal CE1 and accessed through the channel CH0, their read delay parameters and write delay parameters may be different from those applied to the data lines DQ0 of the dies controlled by the chip-enable signal CE0 and accessed through the channel CH0.

In another exemplary embodiment, the dies are grouped in a more fine-grained manner, different zone delay parameters are applied to the different dies. The proposed command may use address information to specify: a specific channel CH_S; a specific chip-enable signal number (CE_S); a specific die number (SU_S), and a specific data-line number (DQ_S). For example, the read delay parameter and the write delay parameter applied to the data line DQ0 of the die SU_S0 controlled by the chip-enable signal CE0 and accessed through the channel CH0 may be exclusive and different from those applied to the data line DQ0 of the die SU_S1 controlled by the chip-enable signal CE0 and accessed through the channel CH0.

In an exemplary embodiment, the proposed command further indicates a timing shift unit, the read delay length, and the write delay length, which present the read delay parameter and the write delay parameter of the specified storage zone.

According to a command that specifies a storage zone to set its read delay parameter and write delay parameter, the signal timing adjustment circuit 110 achieves data alignment (signal deskew) in an electrical manner.

In an exemplary embodiment, the signal timing adjustment circuit 110 electrically delays the read data transmission on the data lines (DQ #). The signal timing adjustment circuit 110 may further delay, in an electrical manner, the interpretation of the data received from the data lines (DQ #), to correctly obtain the write data to be programmed into the target die.

In an exemplary embodiment, when the data storage device 100 is powered on (or activated for the first time of use), the controller 104 performs a delay parameter training on the different storage zones of the non-volatile memory 102, and then sends the proposed commands through the data lines 106 to pass the training result to the non-volatile memory 102 as the zone delay parameters. In an exemplary embodiment, after the signal timing adjustment circuit 110 responds to the commands from the controller 104 to complete the signal timing adjustment for the data lines DQ0-DQ7 of the different storage zones, the controller 104 is allowed to read the non-volatile memory 102 to obtain and execute an in-system program (ISP) code. After the execution of the ISP, the controller 104 operates the non-volatile memory 102 in response to the read/write requests from the host 108. In this manner, after the booting up, the signal timing adjustment circuit 110 at the non-volatile memory 102 side has the capability of signal deskew. No matter dividing the non-volatile memory 102 into storage zones by which granularity, the registers of the controller 104 are not occupied by the zone delay parameters.

In an exemplary embodiment, a set feature command is used as the proposed command.

Figure 2:
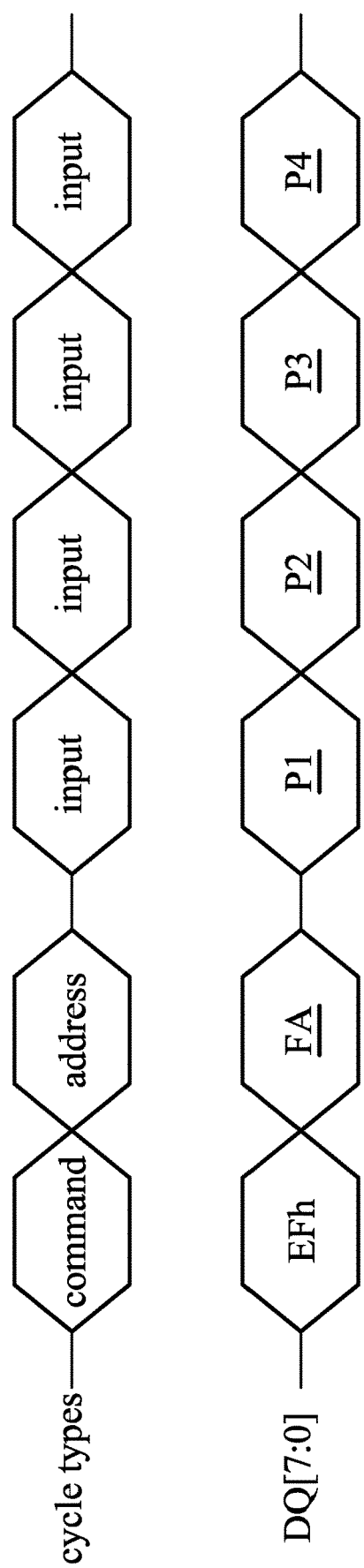
FIG. 2 illustrates how a set feature command is used in accordance with an exemplary embodiment of the present invention.

FIG. 2 illustrates how a set feature command is used in accordance with an exemplary embodiment of the present invention. As shown, the cycle types include: "command"; "address"; and "input". The data lines DQ[7:0] transfer: the command code 'EFh' of the set feature command; the address FA indicating the specified storage zone; the write delay length P1; the read delay length P2; the timing shift unit P3; and a reserved cycle P4. The address FA can specify a specific channel CH_S, a specific data-line number (DQ_S), and even a specific chip-enable signal number (CE_S). The above-mentioned read delay parameter (P2×P3) and write delay parameter (P1×P3) may be obtained by combining the write delay length P1, the read delay length P2, and the timing shift unit P3. The read delay parameters and the write delay parameters of the different storage zones are sent to the non-volatile memory 102 by the controller 104 on a command-by-command basis.

In another exemplary embodiment, a customized command is used as the proposed command.

Figure 3:
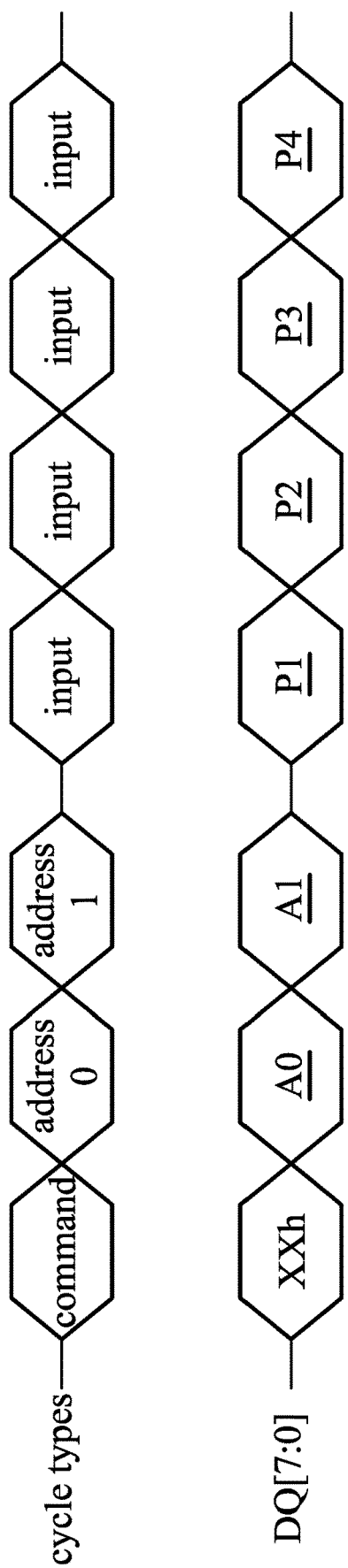
FIG. 3 illustrates how a customized command is used in accordance with an exemplary embodiment of the present invention.

FIG. 3 illustrates how a customized command is used in accordance with an exemplary embodiment of the present invention. As shown, the cycle types include: "command"; "address 0"; "address 1"; and "input". The data lines DQ[7:0] transfer: the command code 'XXh' of the customized command; addresses A0 and A1 which indicate a specified storage zone; the write delay length P1; the read delay length P2; the timing shift unit P3; and the reserved cycle P4. The address A0 can specify a specific channel CH_S, a specific data-line number (DQ_S), and a specific chip-enable signal number (CE_S). The address A1 can specify a specific die number (SU_S) to achieve the signal deskew in a more fine-grained manner. The above-mentioned read delay parameter (P2×P3) and write delay parameter (P1×P3) may be obtained by combining the write delay length P1, the read delay length P2, and the timing shift unit P3. The read delay parameters and the write delay parameters of the different storage zones are sent to the non-volatile memory 102 by the controller 104 on a command-by-command basis.

Figure 4:
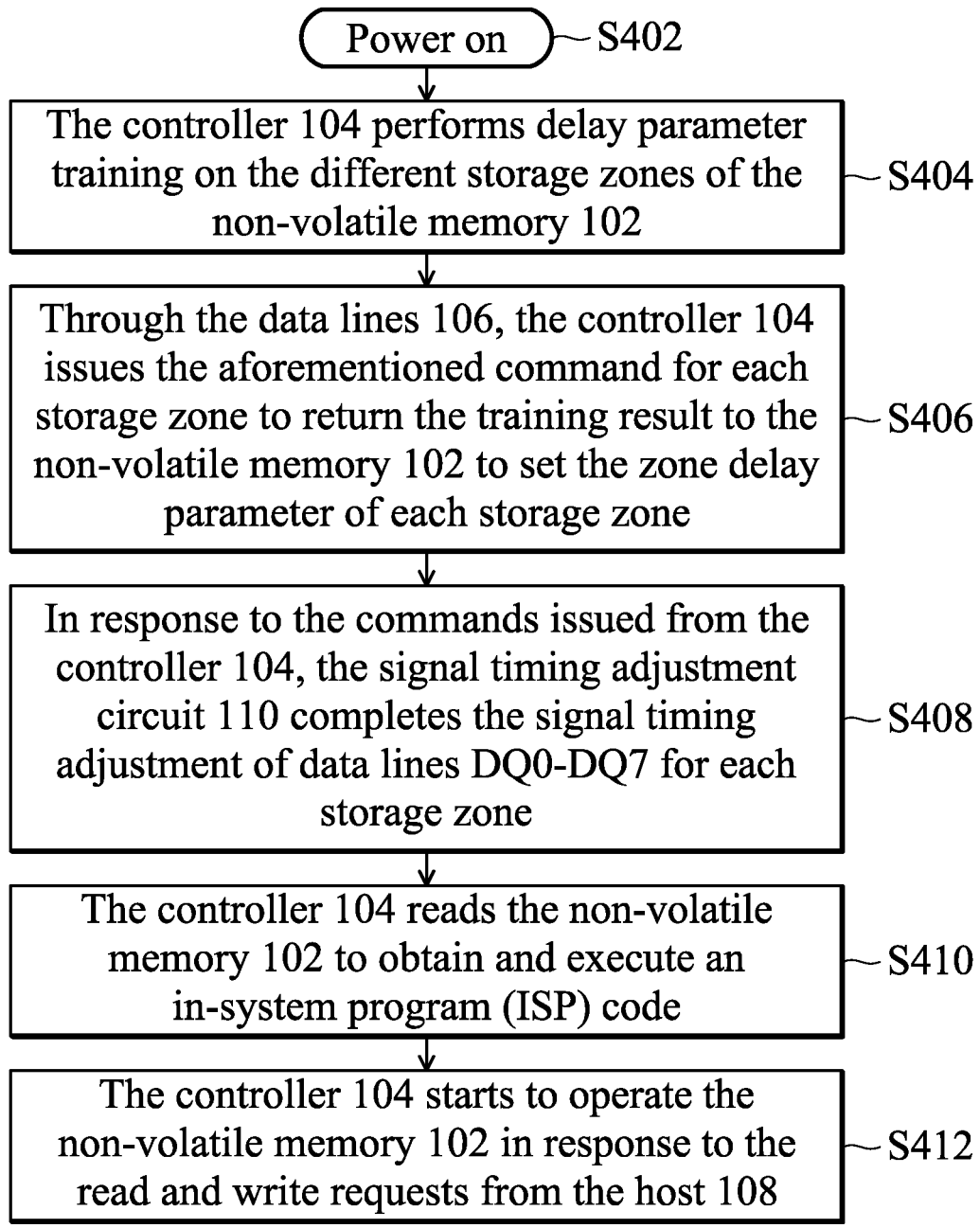
FIG. 4 is a flow chart illustrating the delay-parameter setting procedure in accordance with an exemplary embodiment of the present invention.

FIG. 4 is a flow chart illustrating the delay-parameter setting procedure in accordance with an exemplary embodiment of the present invention.

In step S402, the data storage device 100 is powered on.

In step S404, the controller 104 performs delay parameter training on the different storage zones of the non-volatile memory 102.

In step S406, through the data lines 106, the controller 104 issues the aforementioned command for each storage zone to return the training result to the non-volatile memory 102 to set the zone delay parameter of each storage zone.

In step S408, in response to the commands issued from the controller 104, the signal timing adjustment circuit 110 completes the signal timing adjustment of data lines DQ0-DQ7 for each storage zone.

In step S410, the controller 104 reads the non-volatile memory 102 to obtain and execute an in-system program (ISP) code.

In step S412, the controller 104 starts to operate the non-volatile memory 102 in response to the read and write requests from the host 108.

The aforementioned concepts can be used to implement a non-volatile memory control method. The method includes: providing a signal timing adjustment circuit 110 on a non-volatile memory 102 that includes a plurality of dies, wherein the dies are grouped into storage zones; and operating the controller 104 to issue a plurality of commands to provide zone delay parameters to the non-volatile memory 102 through data lines 106 which couple the controller 104 to the non-volatile memory 102 to drive the signal timing adjustment circuit 110 to separately adjust data-line timing of the different storage zones.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
a non-volatile memory, including a plurality of dies, and a signal timing adjustment circuit, wherein the dies are grouped into storage zones; and
a controller, and a plurality of data lines coupling the controller to the non-volatile memory, wherein, through the data lines, the controller issues a plurality of commands to provide zone delay parameters to the non-volatile memory to drive the signal timing adjustment circuit to separately adjust data-line timing of the different storage zones;
wherein:
each die corresponds to multiple data lines for reading and writing; and
the commands each uses address information to specify a specific data-line number of a specific storage zone of the non-volatile memory to set read delay parameters and write delay parameters; and
the dies of the non-volatile memory are accessed through a plurality of channels, the dies sharing the same channel are activated by a plurality of chip-enable signals in an interleaved way, each chip-enable signal controls at least one die in each channel, and each die is coupled to multiple data lines which have different data-line numbers.

2. The data storage device as claimed in claim 1, wherein:
the commands each uses the address information to specify a specific data-line number of a specific channel to set read delay parameters and write delay parameters.

3. The data storage device as claimed in claim 2, wherein:
each command further specifies a specific chip-enable signal to indicate, in a more fine-grained manner, the specified storage zone for delay-parameter setting.

4. The data storage device as claimed in claim 3, wherein:
each command further specifies a specific die activated by the specified chip-enable signal to indicate, in a more fine-grained manner, the specified storage zone for delay-parameter setting.

5. The data storage device as claimed in claim 1, wherein:
each command further indicates a timing shift unit, a read delay length, and a write delay length.

6. The data storage device as claimed in claim 1, wherein:
the signal timing adjustment circuit electrically delays read data transmission on the data lines; and
the signal timing adjustment circuit electrically delays interpretation of write data received from the data lines.

7. The data storage device as claimed in claim 1, wherein:
when the data storage device is powered on, the controller performs delay parameter training on the different storage zones of the non-volatile memory, and then issues the commands to the non-volatile memory through the data lines to return training results to the non-volatile memory as the zone delay parameters.

8. The data storage device as claimed in claim 7, wherein:
the controller reads the non-volatile memory to obtain and execute an in-system program code after the signal timing adjustment circuit responds to the commands issued from the controller to complete signal timing adjustment of data lines for each storage zone.

9. A data storage device, comprising:
a non-volatile memory, including a plurality of dies, and a signal timing adjustment circuit, wherein the dies are grouped into storage zones; and
a controller, and a plurality of data lines coupling the controller to the non-volatile memory, wherein, through the data lines, the controller issues a plurality of commands to provide zone delay parameters to the non-volatile memory to drive the signal timing adjustment circuit to separately adjust data-line timing of the different storage zones;
wherein each command further indicates a timing shift unit, a read delay length, and a write delay length.

10. The data storage device as claimed in claim 9, wherein:
each die corresponds to multiple data lines for reading and writing; and
the commands each uses address information to specify a specific data-line number of a specific storage zone of the non-volatile memory to set read delay parameters and write delay parameters.

11. The data storage device as claimed in claim 10, wherein:
the dies of the non-volatile memory are accessed through a plurality of channels, the dies sharing the same channel are activated by a plurality of chip-enable signals in an interleaved way, each chip-enable signal controls at least one die in each channel, and each die is coupled to multiple data lines which have different data-line numbers.

12. The data storage device as claimed in claim 11, wherein:
the command each uses the address information to specify a specific data-line number of a specific channel to set read delay parameters and write delay parameters.

13. The data storage device as claimed in claim 12, wherein:
each command further specifies a specific chip-enable signal to indicate, in a more fine-grained manner, the specified storage zone for delay-parameter setting.

14. The data storage device as claimed in claim 13, wherein:
each command further specifies a specific die activated by the specified chip-enable signal to indicate, in a more fine-grained manner, the specified storage zone for delay-parameter setting.

15. The data storage device as claimed in claim 9, wherein:
the signal timing adjustment circuit electrically delays read data transmission on the data lines; and
the signal timing adjustment circuit electrically delays interpretation of write data received from the data lines.

16. The data storage device as claimed in claim 9, wherein:
when the data storage device is powered on, the controller performs delay parameter training on the different storage zones of the non-volatile memory, and then issues the commands to the non-volatile memory through the data lines to return training results to the non-volatile memory as the zone delay parameters.

17. The data storage device as claimed in claim 16, wherein:
the controller reads the non-volatile memory to obtain and execute an in-system program code after the signal timing adjustment circuit responds to the commands issued from the controller to complete signal timing adjustment of data lines for each storage zone.

18. A data storage device, comprising:
a non-volatile memory, including a plurality of dies, and a signal timing adjustment circuit, wherein the dies are grouped into storage zones; and
a controller, and a plurality of data lines coupling the controller to the non-volatile memory, wherein, through the data lines, the controller issues a plurality of commands to provide zone delay parameters to the non-volatile memory to drive the signal timing adjustment circuit to separately adjust data-line timing of the different storage zones;
wherein
when the data storage device is powered on, the controller performs delay parameter training on the different storage zones of the non-volatile memory, and then issues the commands to the non-volatile memory through the data lines to return training results to the non-volatile memory as the zone delay parameters.

19. The data storage device as claimed in claim 18, wherein:
the controller reads the non-volatile memory to obtain and execute an in-system program code after the signal timing adjustment circuit responds to the commands issued from the controller to complete signal timing adjustment of data lines for each storage zone.

* * * * *